(12) United States Patent
Binder et al.

(10) Patent No.: US 12,041,426 B2
(45) Date of Patent: Jul. 16, 2024

(54) DEVICE FOR ADAPTING THE VOLUME IN AN AUDIO SYSTEM

(71) Applicant: Bayerische Motoren Werke Aktiengesellschaft, Munich (DE)

(72) Inventors: Markus Binder, Landshut (DE); Andrea Stupiggia, Deisenhofen (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 175 days.

(21) Appl. No.: 17/782,528

(22) PCT Filed: Nov. 10, 2020

(86) PCT No.: PCT/EP2020/081604
§ 371 (c)(1),
(2) Date: Jun. 3, 2022

(87) PCT Pub. No.: WO2021/110374
PCT Pub. Date: Jun. 10, 2021

(65) Prior Publication Data
US 2023/0010609 A1    Jan. 12, 2023

(30) Foreign Application Priority Data
Dec. 6, 2019  (DE) ..................... 10 2019 133 289.3

(51) Int. Cl.
*H04R 3/00*     (2006.01)
*G08B 21/18*    (2006.01)
(52) U.S. Cl.
CPC ............. *H04R 3/00* (2013.01); *G08B 21/182* (2013.01); *H04R 2430/01* (2013.01)

(58) Field of Classification Search
CPC ..... H04R 3/00; H04R 2430/01; G08B 21/182
See application file for complete search history.

(56) References Cited

U.S. PATENT DOCUMENTS

| | | | |
|---|---|---|---|
| 2008/0015851 A1 | 1/2008 | Yamada | |
| 2010/0046765 A1* | 2/2010 | De Bruijn | H03G 3/001 381/104 |

(Continued)

FOREIGN PATENT DOCUMENTS

| | | |
|---|---|---|
| DE | 10 2009 018 799 A1 | 11/2010 |
| DE | 10 2012 014 310 A1 | 5/2014 |

(Continued)

OTHER PUBLICATIONS

International Search Report (PCT/ISA/210) issued in PCT Application No. PCT/EP2020/081604 dated May 7, 2021 with English translation (12 pages).

(Continued)

*Primary Examiner* — Andrew L Sniezek
(74) *Attorney, Agent, or Firm* — Crowell & Moring LLP

(57) ABSTRACT

A device for adapting the volume of an audio signal in an audio system includes a control unit that determines the loudness of a first audio signal of a first entertainment source or the volume setting of a controller of the audio system, and adapts the volume setting of the controller of the audio system on the basis of the loudness of the first audio signal or the volume setting of the controller, or emits a signal in order to indicate to a user a change between the loudness of the first audio signal of the first entertainment source or the volume setting of the controller of the audio system and a respective specified threshold.

15 Claims, 1 Drawing Sheet

(56) References Cited

U.S. PATENT DOCUMENTS

| | | |
|---|---|---|
| 2010/0272290 A1 | 10/2010 | Carroll |
| 2012/0288121 A1 | 11/2012 | Matsui et al. |
| 2014/0140537 A1 | 5/2014 | Soulodre |
| 2018/0013394 A1 | 1/2018 | Grimm et al. |
| 2018/0083586 A1 | 3/2018 | Scharrer et al. |

FOREIGN PATENT DOCUMENTS

| | | |
|---|---|---|
| DE | 10 2017 115 170 A1 | 1/2018 |
| JP | 2007-250062 A | 9/2007 |
| JP | 2010-200013 A | 9/2010 |
| JP | 2018-152151 A | 9/2018 |
| WO | WO 2016/193033 A1 | 12/2016 |

OTHER PUBLICATIONS

German-language Written Opinion (PCT/ISA/237) issued in PCT Application No. PCT/EP2020/081604 dated May 7, 2021 (17 pages).

German-language Search Report issued in German Application No. 10 2019 133 289.3 dated Apr. 14, 2021 with partial English translation (14 pages).

\* cited by examiner

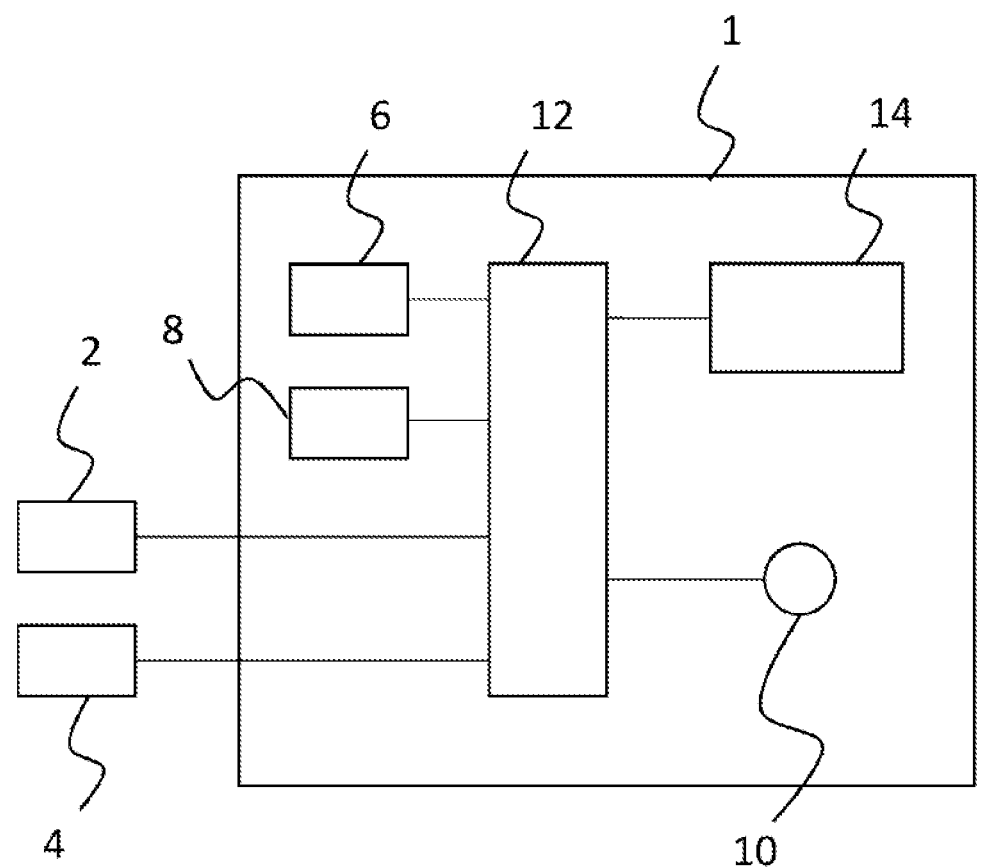

DEVICE FOR ADAPTING THE VOLUME IN AN AUDIO SYSTEM

BACKGROUND AND SUMMARY

The invention relates to a device for adapting the volume in an audio system, in particular in a motor vehicle. The invention also relates to a motor vehicle having such a device and to a method for adapting the volume in an audio system, in particular in a motor vehicle.

In audio systems, such as automotive audio systems, Hi-Fi systems or other audio systems, music can usually be played from various entertainment sources that are either external or integrated into the audio system. External entertainment sources include smartphones or tablets, for example, that can be connected to the audio system via Bluetooth or an AUX input to output music through the audio system. For example, integrated entertainment sources can be CD players or radios.

In various situations, the output of an audio signal through the audio system can be very quiet:
 the user has set the volume of the external entertainment source to low, e.g. because he/she has listened to music on the external entertainment source through headphones before using the entertainment source with the audio system, and/or
 the user is listening to a very quiet piece of music (e.g. classical music).

The user intuitively sets the volume control of the audio system to a very high level so that the music can now be heard at normal volume. If the user then switches from one entertainment source to another entertainment source (from external to internal, internal to external, internal to internal, or external to external), i.e. if a "source change" takes place, a large abrupt change in volume may occur in the audio system because the volume setting of the audio system has been adjusted upwards. This change in volume, for example up to 50 dB, can be very unpleasant and, for example, in motor vehicles it can even become a safety issue because a driver of a motor vehicle can be surprised by this change in volume and react accordingly in an uncontrolled manner.

The object of the invention is therefore to provide a volume control which can be used to prevent abrupt changes in the volume level when an audio signal is output from an entertainment source, for example when the source is changed.

This object is achieved by means of a device for adapting the volume of an audio signal in an audio system according to the present disclosure and a method for adapting the volume of an audio signal in an audio system according to the present disclosure.

The device is used to adapt the volume of an audio signal in an audio system, for example in a motor vehicle, wherein the audio signal is output from one or more external entertainment sources or from one or more internal entertainment sources.

In this context, an entertainment source can be understood to mean an audio source that can be used to output entertainment such as music or audiobooks in the form of audio signals. The internal entertainment source, for example an in-vehicle entertainment source, may include such items as a radio, a CD player integrated into the audio system, a hard disk integrated into the audio system, or a memory card which is connected, for example, via a USB port ("USB stick").

The external entertainment source can be connected to the audio system via Bluetooth or an AUX input, for example.

The external entertainment source has a volume control that allows a user to adjust the volume of the audio signal output via Bluetooth or the AUX input directly on the external entertainment source. For example, the external entertainment source could be a smartphone or an MP3 player.

The audio signals from the external entertainment sources and the internal entertainment sources are output via the speaker system of the audio system. The volume of the audio signal output via the audio system can be adjusted directly in the audio system via a controller arranged there.

It is possible to switch between a first entertainment source and a second entertainment source, which may involve switching between different external entertainment sources, switching between an internal and an external entertainment source, switching between an external and an internal entertainment source, or switching between two internal entertainment sources. Switching between a first and a second entertainment source can also mean disconnecting and reconnecting with the same external entertainment source. In this case, the external entertainment source is both the first entertainment source and the second entertainment source that was previously connected but then disconnected again.

If a volume in the audio system is adjusted with the controller and then a source switching described above occurs, an unexpected abrupt change in volume up or down may occur. Such an abrupt volume change can be undesirable and in certain situations, for example in a motor vehicle, can give rise to critical situations. In particular when the volume is increased, a driver may be surprised and react to it with unexpected movements that give rise to a safety-critical situation.

To prevent this, the device has a control unit that is configured to determine the loudness of the audio signal of the first entertainment source and/or the volume setting of the audio system controller.

Based on the loudness of the audio signal from the first entertainment source and/or the volume setting of the audio system controller, the control unit can adapt the volume setting of the audio system controller and/or output a signal to alert a user to a difference between the loudness of the audio signal from the first entertainment source and/or between the volume setting of the audio system controller and a predefined threshold. Thus, on the one hand, the user can be informed that an abrupt volume change is to be expected. Alternatively or in addition, the volume of the audio signal can be adapted automatically. In the latter case, an abrupt volume change can be prevented before it occurs.

According to one embodiment, the control unit is configured to first detect a switching between the first entertainment source and the second entertainment source. If such a switch has taken place, the control unit is additionally configured to determine the loudness of the audio signal of the first entertainment source and/or the volume setting of the audio system controller. It is particularly when switching between the entertainment sources that an abrupt volume change can occur. This is the case, for example, if an external entertainment source that was connected to the audio system has the volume on the external entertainment source set very low and the audio system controller was therefore set to loud.

If a user then switches to another external entertainment source that does not have its own volume set to low, or to an internal entertainment source, the current volume setting of the audio system controller will cause the volume in the audio system to be very loud. This can be avoided by using the control unit described here. Since the control unit is able to detect a switch between entertainment sources, it can therefore, if necessary, determine the loudness/volume setting as explained above and then subsequently adapt the volume setting of the audio system controller.

The volume setting of the controller controls the volume of the output audio signal that can be adjusted by the controller.

The loudness can be measured continuously or on demand. For example, the loudness can be measured as an LKFS value (loudness, K-weighted, relative to full scale). The LKFS value is a loudness standard that allows the normalization of audio levels for television broadcasts and other video transmission. The measured LKFS value can be understood in particular as the average LKFS value, i.e. the value averaged over a series of short measurements taken in succession. When considering the whole spectrum of music pieces (from very quiet, e.g. classical music, to very loud, e.g. rock music), the LKFS value usually varies between approximately −4 and −30 (the so-called normal LKFS value range).

The LKFS value of an external entertainment source measured by the control unit has a value that depends on the volume setting in the external entertainment source. This means that the LKFS value measured in the audio system may differ from the original LKFS value of a piece of music on the external terminal device if the volume in the external terminal device is not set to maximum. This also means that if the same piece of music is played through an internal or external entertainment source, even with the same unchanged volume setting of the audio system controller it will be played at different volumes.

The loudness or LKFS value of the first entertainment source measured by the control unit is also referred to in the following as $LKFS_A$. The volume setting of the audio system controller is also referred to in the following as $INK_{FZG}$. The volume setting in an external entertainment source is also referred to in the following as $INK_{EXT}$.

According to one embodiment, the control unit is configured to adapt the volume setting of the audio system controller $INK_{FZG}$ if the volume of the first entertainment source $LKFS_A$ falls below a predefined volume threshold and if the volume setting of the audio system controller $INK_{FZG}$ exceeds a specified volume setting threshold.

According to this embodiment, the volume setting of the audio system controller $INK_{FZG}$ is automatically reduced when a large sudden volume change is expected on switching from the first entertainment source to the second entertainment source. This can be the case, for example, if the volume setting of the audio system controller $INK_{FZG}$ is set very high and the loudness value of the first entertainment source $LKFS_A$ is very low (which can be the case if a volume setting $INK_{EXT}$ in the first entertainment source is set to a low value). The specified volume setting threshold can be defined in advance as a value that corresponds to a very loud abrupt volume change that is likely to adversely affect a user, e.g. the driver.

If the measured loudness value of the first entertainment source $LKFS_A$ and the volume setting of the controller in the audio system $INK_{FZG}$ are within a normal range (e.g. $LKFS_A$ value between −14 to −30 and a medium setting of the volume $INK_{FZG}$), no adaptation of the volume setting of the audio system controller $INK_{FZG}$ is made, as no sudden change in volume is to be expected.

If the loudness value of the first entertainment source $LKFS_A$ is very low and a medium volume setting of the audio system controller $INK_{FZG}$ is applied, no adjustment will be made either, as no sudden upward change in volume is to be expected.

If the volume setting of the audio system controller $INK_{FZG}$ is set very high but the loudness value of the first entertainment source $LKFS_A$ is within a normal range, it can be assumed that the volume setting of the controller in the audio system is intended.

However, if the volume setting of the audio system controller $INK_{FZG}$ is in a dangerous range, i.e. is set very loud, while the loudness value of the first entertainment source $LKFS_A$ is very low, a large abrupt change in volume will occur when the source is changed. In this case, according to this embodiment the volume setting of the audio system controller $INK_{FZG}$ will therefore be adapted to prevent a dangerous unexpected increase in the volume for the user. The volume adaptation can also be performed automatically in all cases in order to reliably prevent an abrupt volume change.

When adapting the volume setting of the audio system controller ($INK_{FZG}$), the volume setting of the audio system controller ($INK_{FZG}$) can be set to a fixed value. This value can be selected such that the volume of the output signal varies within a normal range.

According to another embodiment, the control unit is configured to determine a mean value $LKFS_{B\_Mean}$ of the loudness of the second entertainment source and/or to measure the loudness $LKFS_B$ of the second entertainment source and to adapt the volume setting of the audio system controller $INK_{FZG}$ based on the current volume setting of the audio system controller $INK_{FZG}$, the loudness value $LKFS_A$ of the first entertainment source, and the mean loudness value of the second entertainment source $LKFS_{B\_Mean}$ or the measured value $LKFS_B$ of the loudness of the second entertainment source.

For example, the mean value can be determined as an average of a series of measured values.

For example, the volume of the audio system controller can be set according to $INK_{FZG(new)} = INK_{FZG(old)} - (LKFS_A - LKFS_{B\_Mean})$. If a measured value of the loudness of the second entertainment source is used instead of a mean value, the volume can be set according to $INK_{FZG} = INK_{FZG} - (LKFS_A - LKFS_B)$. By measuring the loudness of the second entertainment source $LKFS_B$, the adaptation can be refined because the actual value is always used. In addition, it can be specified that the loudness of the second entertainment source $LKFS_B$ is set to a minimum value if the actual measured value falls below this minimum value.

According to another embodiment, the control unit can be designed to repeat an adaptation of the volume setting of the audio system controller $INK_{FZG}$ after a predefined period of time, based on a new measurement of the loudness of the second entertainment source $LKFS_B$. By this fresh adaptation of the volume setting, potential, normal fluctuations in the loudness values of the second entertainment source $LKFS_B$ can be taken into account. Such fluctuations are based, for example, on different loudnesses of individual pieces of music, which are independent of the actual settings.

According to another embodiment, the control unit is configured to adapt the volume setting in a ramp-like or incremental manner.

Such a ramp-like or incremental adjustment ensures a smooth transition for the user when the volume is slightly increased or decreased. This also prevents unexpected abrupt volume changes.

According to another embodiment, the control unit is configured to determine whether the first entertainment source is an external source and whether the loudness of the first entertainment source $LKFS_A$ falls below a predefined loudness threshold, and to output a signal to inform the user that the loudness is very low and the volume control of the first external entertainment source must be operated.

This embodiment allows the user to be informed that the control on the first, external, entertainment source is set very low. Instead of setting the audio system controller to very loud, which can result in an abrupt volume change when switching between sources, the user is informed that he/she should instead operate the control on the external entertainment source. In this way, a sudden volume change can be prevented even before it occurs.

According to another embodiment, the control unit is configured to determine whether the loudness of the first entertainment source $LKFS_A$ falls below a predefined loudness threshold and whether the volume setting of the controller of the audio system exceeds a specified loudness setting threshold, and to output a signal to inform the user that the volume setting of the audio system is very high and the volume controller of the audio system must be operated.

According to this embodiment, the user can be informed that an abrupt volume change is to be expected. This increases safety because the user is not surprised by a sudden increase in volume. This informing of the user can also be combined with an automatic volume adjustment as described above. Alternatively, the information may be used to advise the user to reduce the volume setting of the audio system controller in the vehicle in order to avoid an unpleasant or alarming abrupt volume change.

According to another aspect, a motor vehicle having a device as described above is proposed.

According to another aspect, a method for adapting the volume of an audio signal in an audio system is proposed, wherein the audio signal is output from a first entertainment source or from a second entertainment source via the audio system, the volume of the audio signal being adjustable by means of a controller of the audio system. The method comprises the following steps: determining the loudness of the audio signal of the first entertainment source and/or a volume setting of the controller of the audio system, calculating a difference between the loudness of the audio signal of the first entertainment source and/or the volume setting of the controller of the audio system and a predefined threshold, and, based on the loudness of the audio signal of the first entertainment source and/or the volume setting of the controller of the audio system, adapting the volume setting of the controller of the audio system and/or outputting a signal to alert a user to a difference between the loudness of the audio signal of the first entertainment source and/or the volume setting of the controller of the audio system and a predefined threshold value.

The embodiments and features described for the proposed device also apply correspondingly to the proposed method.

Furthermore, a computer program product is proposed which contains a program code that is designed to cause the method as described above to be executed on a computer.

A computer program product, such as a computer program means, can be provided or supplied as a storage medium, such as a memory card, USB stick, CD-ROM, DVD, or else in the form of a downloadable file from a server to a network. This may be effected, for example, in a wireless communication network by the transmission of a corresponding file with the computer program or the computer program means.

Further possible implementations of the invention also comprise combinations of features of the invention either described previously or in the following in relation to the exemplary embodiments, which are not explicitly mentioned. A person skilled in the art will also be able to add individual aspects as improvements or additions to each basic form of the present invention.

Further advantages and advantageous embodiments are specified in the description, the drawings and the claims. In particular, the combinations of features specified in the description and in the drawings are purely exemplary, so that the features can also be combined individually or present in other ways.

In the following, the invention will be explained in more detail by reference to exemplary embodiments shown in the drawings. The exemplary embodiments and the combinations shown in the exemplary embodiments are purely exemplary and are not intended to define the scope of protection of the invention. The latter is defined solely by the attached claims.

BRIEF DESCRIPTION OF THE DRAWING

FIG. 1 shows a schematic block diagram of an audio system having a plurality of entertainment sources.

DETAILED DESCRIPTION

In the following, identical or functionally equivalent elements are labelled with the same reference signs.

FIG. 1 shows an audio system 1, for example in a motor vehicle, which can be connected to external entertainment sources 2, 4. The external entertainment sources 2, 4 can be connected to the audio system 1, for example via Bluetooth or an AUX input. In addition, the audio system 1 comprises internal entertainment sources 6, 8. The internal entertainment sources 6, 8 can include such items as a radio, a CD player integrated into the audio system 1 or a hard disk integrated into the audio system, or a memory card which is connected, for example, via a USB port (e.g. a USB stick).

Each of the entertainment sources 2, 4, 6, 8 is used to output entertainment, such as music or audiobooks, in the form of audio signals in the audio system 1. The audio signals are output via a speaker system of the audio system 1.

The volume of the output audio signals can be adjusted by means of a controller 10 in the audio system 1. This controller 10 can be operated by a user. The external entertainment sources 2, 4 also have dedicated volume controls which can be used to adjust the volume of the audio signal output via Bluetooth or the AUX input on the external entertainment source 2, 4. For example, the external entertainment sources 2, 4 could be a smartphone or an MP3 player.

Switching between the entertainment sources 2, 4, 6, 8 or reconnecting to an entertainment source 2, 4, 6, 8 that was previously connected but disconnected again, can cause abrupt volume changes.

For example, if a volume is set in the audio system 1 and then an entertainment source 2, 4, 6, 8 that has a different volume setting is reconnected, this can cause an unexpected abrupt volume change upward or downward. Such an abrupt volume change, in particular if it increases the volume, can surprise a user, such as a driver of a motor vehicle in which the audio system is implemented, causing them to react with unexpected movements that give rise to a safety-critical situation.

To prevent this, a control unit 12 is provided in the audio system 1. The control unit 12 measures a loudness of a first entertainment source 2, 4, 6, 8 that was previously used. In addition, the control unit 12 can determine a volume setting of the controller 10 of the audio system 1.

Based on a difference between the loudness of the first entertainment source and an associated threshold value, and between the volume setting of the controller 10 of the audio system 1 and an associated threshold, the control unit 12 can then adjust the volume setting of the controller 10.

Alternatively or in addition, the control unit 12 can output a signal on a screen 14 of the audio system 1 to alert a user to the difference. Thus, on the one hand, the user can be informed that an abrupt volume change is to be expected. In addition, the display on the screen 14 can alert the user that, for example, the volume setting on the external entertainment source 2, 4 that is currently connected is set very low. The display can also contain an indication that instead of operating the controller 10, the setting on the external entertainment source 2, 4 should be changed.

Alternatively or in addition, the volume setting of the controller 10 of the audio signal output in the audio system 1 can be automatically adapted. In this case, it is possible to prevent an abrupt volume change before it occurs.

It is particularly when switching between the entertainment sources 2, 4, 6, 8 that an abrupt volume change can occur. This is the case, for example, if an external entertainment source 2, 4 that was connected to the audio system 1 has the volume on the external entertainment source 2, 4 set very low, and the controller 10 of the audio system 1 was therefore set to loud. If a user then switches to another external entertainment source 2, 4 that does not have its own volume set to low, or to an internal entertainment source 6, 8, the current setting of the controller 10 will cause the volume in the audio system 1 to be very loud.

To prevent this and to automatically adapt the volume, the control unit 12 is configured to detect a change between the entertainment sources 2, 4, 6, 8 and to adapt the volume setting as described above when a change is detected. Based on the loudness of the first, previous entertainment source 2, 4, 6, 8 and the most recently set volume of the controller 10 of the audio system 1, the control unit 12 can then automatically adjust the volume setting of the controller 10 in the audio system 1.

The volume setting of the controller 10 of the audio system 1 can be adapted if the volume of the output audio signal would exceed or fall below a threshold. Alternatively, the volume can be automatically adapted each time an entertainment source 2, 4, 6, 8 is reconnected. This adaptation can neutralize the effect of the volume control in the external entertainment source 2, 4.

The audio system described here, which comprises a device with a control unit for adapting the volume of an audio signal in the audio system, makes it a simple matter to prevent unexpected abrupt volume changes for a user, such as a driver, when outputting audio signals. It is particularly when switching between different entertainment sources that such abrupt volume changes can occur, which are intercepted by the described device.

REFERENCE SIGNS

1 audio system
2, 4 external entertainment source
6, 8 internal entertainment source
10 volume controller
12 control unit
14 display screen

The invention claimed is:

1. A device for adapting a volume of an audio signal in an audio system, the device comprising:
    a controller configured to:
        determine at least one of a loudness of a first audio signal of a first entertainment source or a volume setting of a controller of the audio system configured to adjust a volume of the first audio signal;
        at least one of:
            adapt, based on the at least one of the loudness of the first audio signal of the first entertainment source or the volume setting of the controller of the audio system, the volume setting of the controller of the audio system, or
            output a signal to alert a user to a difference between the at least one of the loudness of the first audio signal or the volume setting of the controller and a predefined threshold value;
        at least one of determine a mean value of a loudness of a second entertainment source or measure the loudness of the second entertainment source; and
        adapt the volume setting of the controller of the audio system based on the volume setting of the controller, the loudness of the first entertainment source, and at least one of the mean loudness value of the second entertainment source or the measured loudness value of the second entertainment source.

2. The device according to claim 1, wherein the control unit controller is configured to:
    detect a change from the first entertainment source to a second entertainment source; and
    responsively determine the at least one of the loudness of the first audio signal or the volume setting of the controller of the audio system.

3. The device according to claim 2, wherein the controller is configured to:
    adjust the volume setting of the controller of the audio system in response to the loudness of the first entertainment source falling below a predefined loudness threshold and the volume setting of the controller of the audio system exceeding a specified volume setting threshold.

4. The device according to claim 1, wherein the controller is configured to repeat an adaptation of the volume setting of the controller of the audio system after a predefined period of time.

5. The device according to claim 1, wherein the controller is configured to adapt the volume setting in at least one of a ramp-like or incremental manner.

6. The device according to claim 1, wherein the controller is configured to:
    determine whether the loudness of the first entertainment source falls below a predefined loudness threshold; and
    output a signal to inform the user that the loudness is very low and the volume control of the first entertainment source must be operated.

7. The device according to claim 1, wherein the controller is configured to:
    determine whether the loudness of the first entertainment source falls below a predefined loudness threshold and determine whether the volume setting of the controller of the audio system exceeds a specified loudness threshold; and
    output a signal to inform the user that the volume setting of the audio system is high and the volume control of the audio system must be operated.

8. A motor vehicle comprising the device according to claim 1.

9. A method for adapting a volume of an audio signal in an audio system, the method comprising:
- determining, by a controller, at least one of a loudness of a first audio signal of a first entertainment source or a volume setting of a controller of the audio system configured to adjust a volume of the first audio signal;
- at least one of:
  - adapting, by the controller, based on the at least one of the loudness of the first audio signal of the first entertainment source or the volume setting of the controller of the audio system, the volume setting of the controller of the audio system, or
  - outputting, by the controller, a signal to alert a user to a difference between the at least one of the loudness of the first audio signal of the first entertainment source or the volume setting of the controller of the audio system and a predefined threshold value;
- at least one of determining, by the controller, a mean value of a loudness of a second entertainment source or measuring, by the controller, the loudness of the second entertainment source; and
- adapting, by the controller, the volume setting of the controller of the audio system based on the volume setting of the controller, the loudness of the first entertainment source, and at least one of the mean loudness value of the second entertainment source or the measured loudness value of the second entertainment source.

10. The method according to claim 9, further comprising:
- detecting, by the controller, a change from the first entertainment source to a second entertainment source; and
- responsively determining, by the controller, the at least one of the loudness of the first audio signal or the volume setting of the controller of the audio system.

11. The method according to claim 10, further comprising:
- adjusting, by the controller, the volume setting of the controller of the audio system in response to the loudness of the first entertainment source falling below a predefined loudness threshold and the volume setting of the controller of the audio system exceeding a specified volume setting threshold.

12. The method according to claim 9, further comprising:
- repeating, by the controller, an adaptation of the volume setting of the controller of the audio system after a predefined period of time.

13. The method according to claim 9, further comprising:
- adapting, by the controller, the volume setting in at least one of a ramp-like or incremental manner.

14. The method according to claim 9, further comprising:
- determining, by the controller, whether the loudness of the first entertainment source falls below a predefined loudness threshold; and
- outputting, by the controller, a signal to inform the user that the loudness is very low and the volume control of the first entertainment source must be operated.

15. The method according to claim 9, further comprising:
- determining, by the controller, whether the loudness of the first entertainment source falls below a predefined loudness threshold and determine whether the volume setting of the controller of the audio system exceeds a specified loudness threshold; and
- outputting, by the controller, a signal to inform the user that the volume setting of the audio system is high and the volume control of the audio system must be operated.

* * * * *